United States Patent
Kim

(10) Patent No.: US 12,513,887 B2
(45) Date of Patent: Dec. 30, 2025

(54) SEMICONDUCTOR DEVICE AND METHOD FOR FABRICATING THE SAME

(71) Applicant: SK hynix Inc., Gyeonggi-do (KR)

(72) Inventor: Seung Hwan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 518 days.

(21) Appl. No.: 17/844,676

(22) Filed: Jun. 20, 2022

(65) Prior Publication Data

US 2023/0217645 A1 Jul. 6, 2023

(30) Foreign Application Priority Data

Dec. 31, 2021 (KR) .................. 10-2021-0194260

(51) Int. Cl.
*H10B 12/00* (2023.01)

(52) U.S. Cl.
CPC ............ *H10B 12/30* (2023.02); *H10B 12/03* (2023.02); *H10B 12/05* (2023.02); *H10B 12/482* (2023.02)

(58) Field of Classification Search
CPC ........ H10B 12/30; H10B 12/03; H10B 12/05; H10B 12/0335
See application file for complete search history.

(56) References Cited

U.S. PATENT DOCUMENTS

| | | | |
|---|---|---|---|
| 2019/0198521 A1* | 6/2019 | Komiya | H10B 41/10 |
| 2020/0168622 A1* | 5/2020 | Fukuzumi | H01L 21/76802 |
| 2021/0057419 A1 | 2/2021 | Shin et al. | |
| 2021/0098573 A1* | 4/2021 | Chen | H01L 29/775 |
| 2022/0246525 A1* | 8/2022 | Kim | H01L 21/76877 |
| 2022/0344339 A1* | 10/2022 | Varghese | H10B 12/30 |
| 2023/0171950 A1* | 6/2023 | Jang | H10B 12/315 257/295 |

FOREIGN PATENT DOCUMENTS

| | | |
|---|---|---|
| KR | 10-2020-0087911 A | 7/2020 |
| KR | 10-2020-0105216 A | 9/2020 |
| KR | 10-2021-0077098 A | 6/2021 |

OTHER PUBLICATIONS

Office Action for Korean Patent Application No. 10-2021-0194260 issued by the Korean Intellectual Property Office (KIPO) on Nov. 18, 2025.

* cited by examiner

*Primary Examiner* — Michele Fan
(74) *Attorney, Agent, or Firm* — IP & T GROUP LLP

(57) ABSTRACT

A method for fabricating a semiconductor device includes: forming a stack body by alternately stacking a plurality of semiconductor layers and a plurality of sacrificial semiconductor layers over a lower structure; forming an opening by etching the stack body; forming a plurality of active layers and a plurality of lateral recesses by etching the semiconductor layers and the sacrificial semiconductor layers through the opening; forming sacrificial dielectric layers partially filling the lateral recesses and contacting the active layers; and replacing the sacrificial dielectric layers with word lines.

20 Claims, 21 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2021-0194260, filed on Dec. 31, 2021, which is incorporated herein by reference in its entirety.

BACKGROUND

1. Field

Various embodiments of the present invention relate to a semiconductor device, and more particularly, to a semiconductor device of a three-dimensional structure, and a method for fabricating the same.

2. Description of the Related Art

The size of a memory cell is being continuously reduced to increase the net die of a memory device. As the size of memory cells is miniaturized, it is required to reduce the parasitic capacitance Cb and increase the capacitance as well. However, it is difficult to increase the net die due to the structural limitation of the memory cells.

Recently, three-dimensional semiconductor memory devices including memory cells that are arranged in three dimensions are being suggested.

SUMMARY

Embodiments of the present invention are directed to a semiconductor device including highly integrated memory cells, and a method for fabricating the same.

In accordance with an embodiment of the present invention, a method for fabricating a semiconductor device includes: forming a stack body by alternately stacking a plurality of semiconductor layers and a plurality of sacrificial semiconductor layers over a lower structure; forming an opening by etching the stack body; forming a plurality of active layers and a plurality of lateral recesses by etching the semiconductor layers and the sacrificial semiconductor layers through the opening; forming sacrificial dielectric layers partially filling the lateral recesses and contacting the active layers; and replacing the sacrificial dielectric layers with word lines.

In accordance with another embodiment of the present invention, a method for fabricating a semiconductor device includes: forming a seed silicon layer over a lower structure; repeatedly forming a sub-stack in which a first monocrystalline silicon germanium layer, a first monocrystalline silicon layer, a second monocrystalline silicon germanium layer, and a second monocrystalline silicon layer are stacked in a mentioned order over the seed silicon layer; forming an opening by etching the sub-stacks and the seed silicon layer; forming initial lateral recesses by removing the first and second monocrystalline silicon germanium layers through the opening; thinning the second monocrystalline silicon layers while removing the first monocrystalline silicon layers to form lateral recesses that are wider than the initial lateral recess and to form thin-body active layers between the lateral recesses; forming sacrificial dielectric layers partially filling the lateral recesses and contacting the thin-body active layers; and replacing the sacrificial dielectric layers with word lines.

In accordance with yet another embodiment of the present invention, a semiconductor device includes: a lower structure; cell isolation dielectric layers that are vertically stacked over the lower structure and parallel to the lower structure; monocrystalline silicon active layers that are disposed between the cell isolation dielectric layers and laterally oriented to be parallel to the lower structure; word lines laterally oriented to cross each of the monocrystalline silicon active layers between the cell isolation dielectric layers; a bit line commonly coupled to one side of the monocrystalline silicon active layers and extending in a direction perpendicular to the lower structure; and capacitors coupled to another side of the monocrystalline silicon active layers.

DETAILED DESCRIPTION

Figure 1:
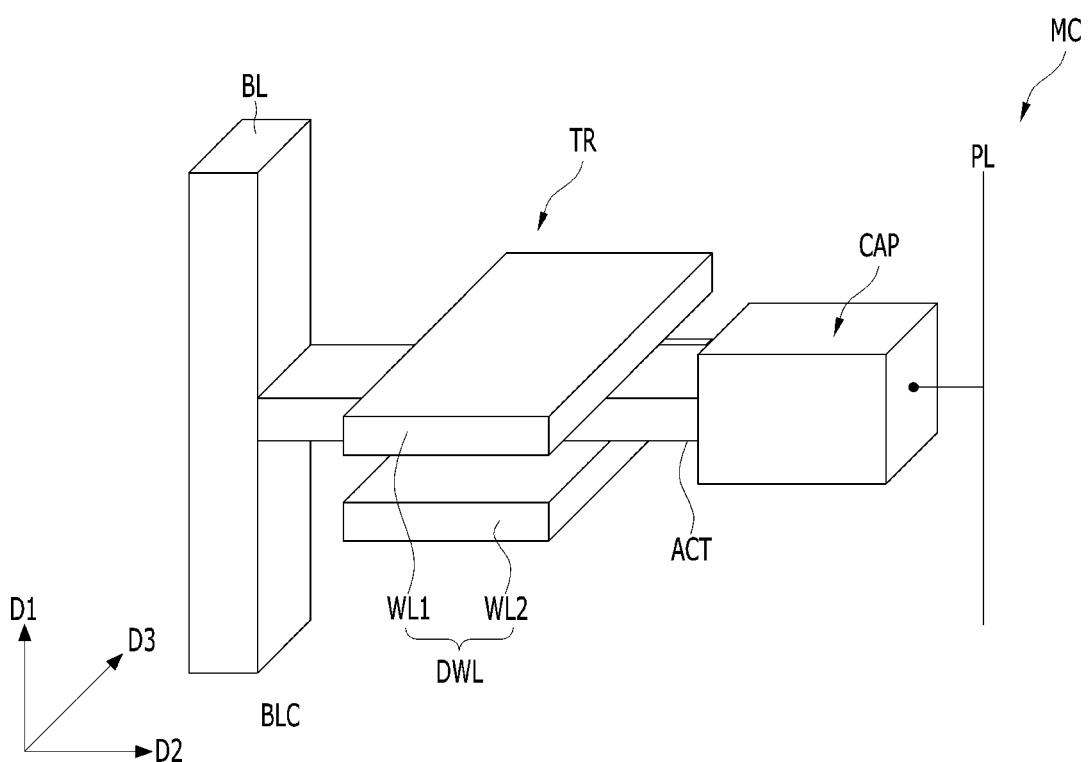
FIG. 1 is a schematic perspective view illustrating a memory cell of a semiconductor device in accordance with embodiments of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

According to the following embodiments of the present invention, it is possible to increase the memory cell density and reduce the parasitic capacitance by vertically stacking memory cells.

Figure 2:
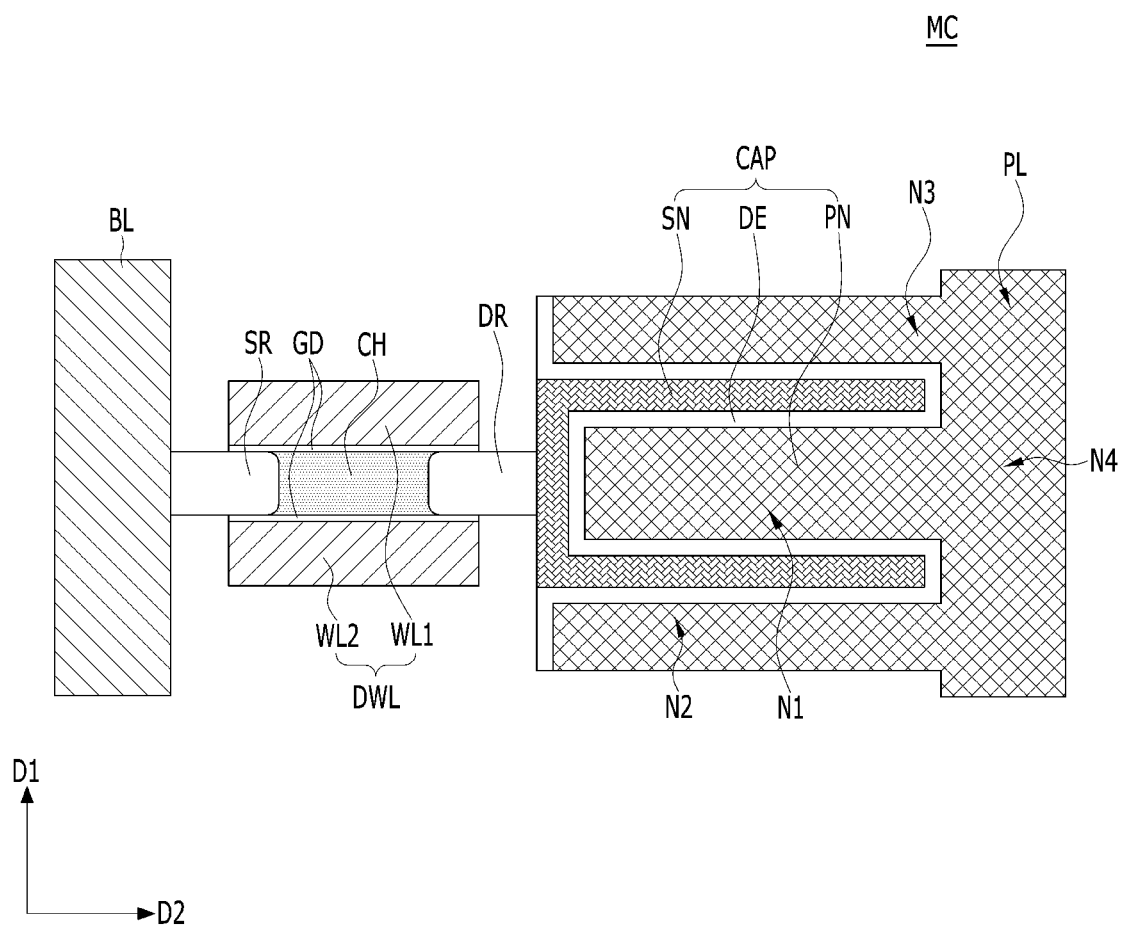
FIG. 2 is a cross-sectional view illustrating the memory cell shown in FIG. 1.

FIG. 1 is a schematic perspective view illustrating a memory cell of a semiconductor device in accordance with embodiments of the present invention. FIG. 2 is a cross-sectional view illustrating the memory cell shown in FIG. 1.

Referring to FIGS. 1 and 2, the memory cell MC of a three-dimensional (3D) semiconductor device in accordance with the embodiments of the present invention may include a bit line BL, a transistor TR, and a capacitor CAP. The transistor TR may include an active layer ACT and a double word line DWL, wherein the double word line DWL may include first and second word lines WL1 and WL2 that are opposite to each other with the active layer ACT interposed therebetween. The capacitor CAP may include a storage node SN, a dielectric layer DE, and a plate node PN.

The bit line BL may have a pillar shape extending in a first direction D1. The active layer ACT may have a bar shape extending in a second direction D2 intersecting with the first direction D1. The double word line DWL may have a line shape extending in a third direction D3 intersecting with the first and second directions D1 and D2. The plate node PN of the capacitor CAP may be coupled to a plate line PL.

The bit line BL may be vertically oriented in a first direction D1. The bit line BL may be referred to as a vertically oriented bit line or a pillar-type bit line. The bit line BL may include a conductive material. The bit line BL may include a silicon-based material, a metal-based material, or a combination thereof. The bit line BL may include silicon, a metal, a metal nitride, a metal silicide, or a combination thereof. The bit line BL may include polysilicon, titanium nitride, tungsten, or a combination thereof. For example, the bit line BL may include polysilicon or titanium nitride (TiN) which is doped with an N-type impurity. The bit line BL may include a TiN/W stack including titanium nitride and tungsten over titanium nitride.

The double word line DWL may extend in a third direction D3, and the active layer ACT may extend in a second direction D2. The active layer ACT may be laterally arranged in the second direction D2 from the bit line BL. The double word line DWL may include a pair of word lines, that is, a first word line WL1 and a second word line WL2. The first word line WL1 and the second word line WL2 may face each other in the first direction D1 with the active layer ACT interposed therebetween. A gate dielectric layer GD may be formed on the upper and lower surfaces of the active layer ACT.

The active layer ACT may include a semiconductor material or an oxide semiconductor material. For example, the active layer ACT may include monocrystalline silicon, germanium, silicon germanium, or indium gallium zinc oxide (IGZO). The active layer ACT may include polysilicon or monocrystalline silicon. The active layer ACT may include a channel CH, a first source/drain region SR between the channel CH and a bit line BL, and a second source/drain region DR between the channel CH and a capacitor CAP. The channel CH may be defined between the first source/drain region SR and the second source/drain region DR. According to the embodiment of the present invention, the active layer ACT may be monocrystalline silicon.

The first source/drain region SR and the second source/drain region DR may be doped with impurities of the same conductivity type.

The first source/drain region SR and the second source/drain region DR may be doped with an N-type impurity or a P-type impurity. The first source/drain region SR and the second source/drain region DR may include at least one impurity selected among arsenic (As), phosphorus (P), boron (B), indium (In), and a combination thereof. A first side of the first source/drain region SR may contact the bit line BL, and a second side of the first source/drain region SR may contact the channel CH. A first side of the second source/drain region DR may contact the storage node SN, and a second side of the second source/drain region DR may contact the channel CH. The second side of the first source/drain region SR and the second side of the second source/drain region DR may partially overlap with the sides of the first and second word lines WL1 and WL2, respectively. The lateral length of the channel CH in the second direction D2 may be smaller than the lateral length of the first and second source/drain regions SR and DR in the second direction D2. According to another embodiment of the present invention, the lateral lengths of the channel CH in the second direction D2 may be greater than the lateral lengths of the first and second source/drain regions SR and DR in the second direction D2.

The transistor TR may be a cell transistor and it may have a double word line DWL. In the double word line DWL, the first word line WL1 and the second word line WL2 may have the same potential. For example, the first word line WL1 and the second word line WL2 may form a pair, and the same word line driving voltage may be applied to the first word line WL1 and the second word line WL2. As described, the memory cell MC according to the embodiment of the present invention may have a double word line DWL in which two first and second word lines WL1 and WL2 are disposed adjacent to one channel CH.

According to another embodiment of the present invention, the first word line WL1 and the second word line WL2 may have different potentials. For example, a word line driving voltage may be applied to the first word line WL1, and a ground voltage may be applied to the second word line WL2. The second word line WL2 may be referred to as a back word line or a shield word line. According to another embodiment of the present invention, the ground voltage may be applied to the first word line WL1, and the word line driving voltage may be applied to the second word line WL2.

The active layer ACT may have a smaller thickness than those of the first and second word lines WL1 and WL2. In other words, the vertical thickness of the active layer ACT in the first direction D1 may be smaller than the vertical thickness of each of the first and second word lines WL1 and WL2 in the first direction D1. Such a thin active layer ACT may be referred to as a thin-body active layer. The thin active layer ACT may include a thin-body channel CH, and the thin-body channel CH may have a thickness of approximately 10 nm or less. According to another embodiment of the present invention, the channel CH may have the same vertical thickness as those of the first and second word lines WL1 and WL2.

The gate dielectric layer GD may include silicon oxide, silicon nitride, a metal oxide, a metal oxynitride, a metal silicate, a high-k material, a ferroelectric material, an anti-ferroelectric material or a combination thereof. The gate dielectric layer GD may include $SiO_2$, $Si_3N_4$, $HfO_2$, $Al_2O_3$, $ZrO_2$, AlON, HfON, HfSiO, HfSiON, or HfZrO.

The double word line DWL may include a metal, a metal mixture, a metal alloy, or a semiconductor material. The double word line DWL may include titanium nitride, tungsten, polysilicon, or a combination thereof. For example, the double word line DWL may include a TiN/W stack in which titanium nitride and tungsten are sequentially stacked. The double word line DWL may include an N-type work function material or a P-type work function material. The N-type work function material may have a low work function of approximately 4.5 eV or less, and the P-type work function material may have a high work function of approximately 4.5 eV or more.

The capacitor CAP may be disposed laterally from the transistor TR in the second direction D2. The capacitor CAP may include a storage node SN that extends laterally from the active layer ACT in the second direction D2. The capacitor CAP may further include a dielectric layer DE and a plate node PN over the storage node SN. The storage node SN, the dielectric layer DE, and the plate node PN may be arranged laterally in the second direction D2. The storage node SN may have a laterally oriented cylinder shape. The dielectric layer DE may conformally cover the cylindrical inner wall and the cylindrical outer wall of the storage node SN. The plate node PN may have a shape extending to the cylindrical inner wall and the cylindrical outer wall of the storage node SN over the dielectric layer DE. The plate node PN may be coupled to the plate line PL. The storage node SN may be electrically connected to the second source/drain region DR.

The storage node SN may have a three-dimensional structure, and the storage node SN of the three-dimensional structure may have a lateral three-dimensional structure which is oriented in the second direction D2. As an example of the three-dimensional structure, the storage node SN may have a cylinder shape. According to another embodiment of the present invention, the storage node SN may have a pillar shape or a pylinder shape. The pylinder shape may refer to a structure in which a pillar shape and a cylinder shape are merged.

The plate node PN may include an internal node N1 and external nodes N2, N3, and N4. The internal node N1 and the external nodes N2, N3, and N4 may be coupled to each other. The internal node N1 may be disposed inside the cylinder of the storage node SN. The external nodes N2 and N3 may be disposed outside the cylinder of the storage node SN with the dielectric layer DE interposed therebetween. The external node N4 may couple the internal node N1 and the external nodes N2 and N3 to each other. The external nodes N2 and N3 may be disposed to surround the cylindrical outer wall of the storage node SN. The external node N4 may serve as a plate line PL.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, a tungsten nitride/tungsten (WN/W) stack. The plate node PN may include a combination of a metal-based material and a silicon-based material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the cylindrical inside of the storage node SN over the titanium nitride, and titanium nitride (TiN) may serve as a plate node PN of a capacitor CAP, and tungsten nitride may be a low-resistance material.

The dielectric layer DE may include silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer DE may be formed of a composite layer including two or more layers of the aforementioned high-k materials.

The dielectric layer DE may be formed of zirconium (Zr)-based oxide. The dielectric layer DE may have a stack structure including at least zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-based layer. According to another embodiment of the present invention, the dielectric layer DE may be formed of hafnium (Hf)-based oxide. The dielectric layer DE may have a stack structure including at least hafnium oxide ($HfO_2$). The stack structure including hafnium oxide ($HfO_2$) may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, aluminum oxide ($Al_2O_3$) may have a greater bandgap energy (which will be, hereinafter, simply referred to as bandgap) than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high-bandgap material having a greater bandgap than the high-k material. The dielectric layer DE may include silicon oxide ($SiO_2$) as a high bandgap material other than aluminum oxide ($Al_2O_3$). Since the dielectric layer DE includes a high bandgap material, leakage current may be suppressed. The high-bandgap material may be thinner than the high-k material. According to another embodiment of the present invention, the dielectric layer DE may include a laminated structure in which a high-k material and a high-bandgap material are alternately stacked. For example, it may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack. In the above laminated structure, aluminum oxide ($Al_2O_3$) may be thinner than zirconium oxide ($ZrO_2$) and hafnium oxide ($HfO_2$).

According to another embodiment of the present invention, the dielectric layer DE may include a stack structure, a laminated structure, or a mixed structure including zirconium oxide, hafnium oxide, and aluminum oxide.

According to another embodiment of the present invention, the dielectric layer DE may include a ferroelectric material or an antiferroelectric material.

According to another embodiment of the present invention, an interface control layer for improving leakage current may be further formed between the storage node SN and the dielectric layer DE. The interface control layer may include titanium oxide ($TiO_2$), niobium oxide, or niobium nitride. The interface control layer may also be formed between the plate node PN and the dielectric layer DE.

The capacitor CAP may include a metal-insulator-metal (MIM) capacitor. The storage node SN and the plate node PN may include a metal-based material.

The capacitor CAP may be replaced with another data storage material. For example, the data storage material may be a phase change material, a magnetic tunnel junction (MTJ), or a variable resistance material.

Figure 3:
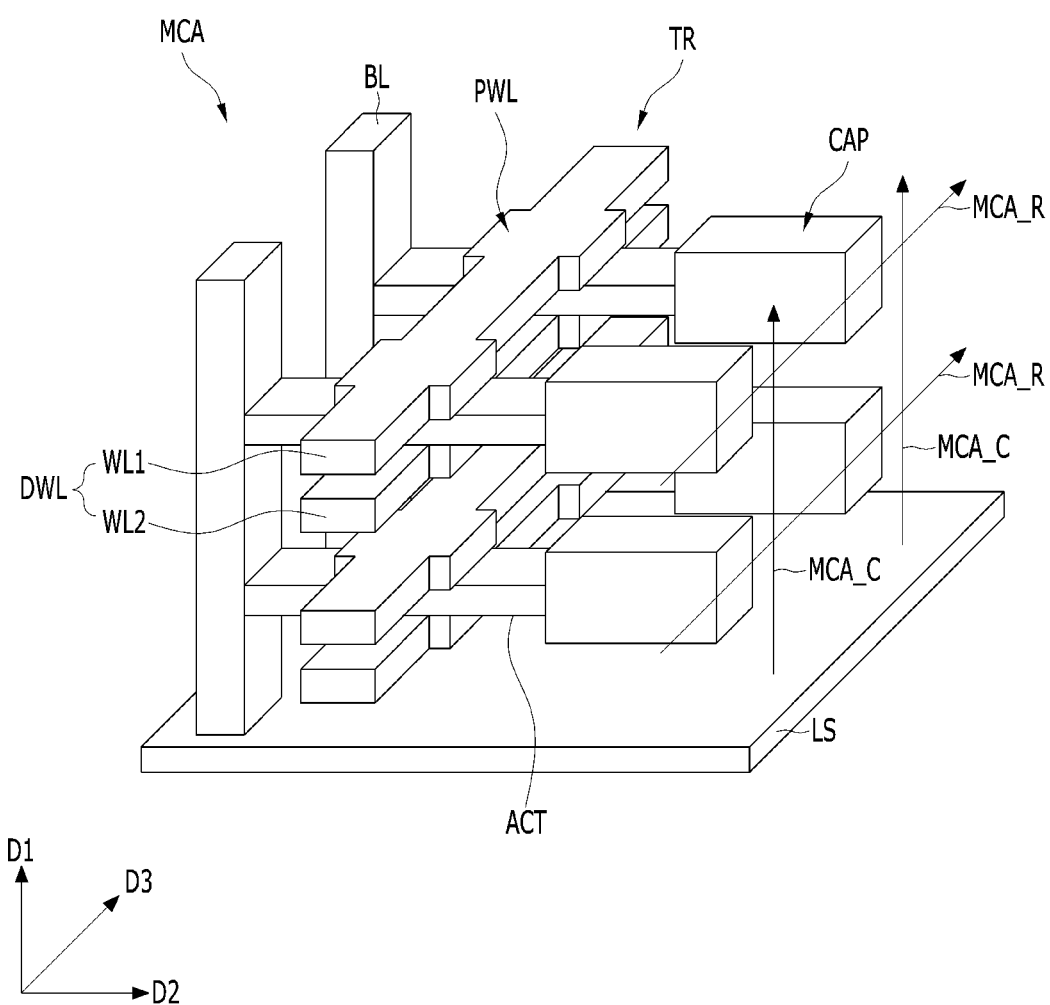
FIG. 3 is a schematic perspective view illustrating a semiconductor device in accordance with an embodiment of the present invention.
Figure 4:
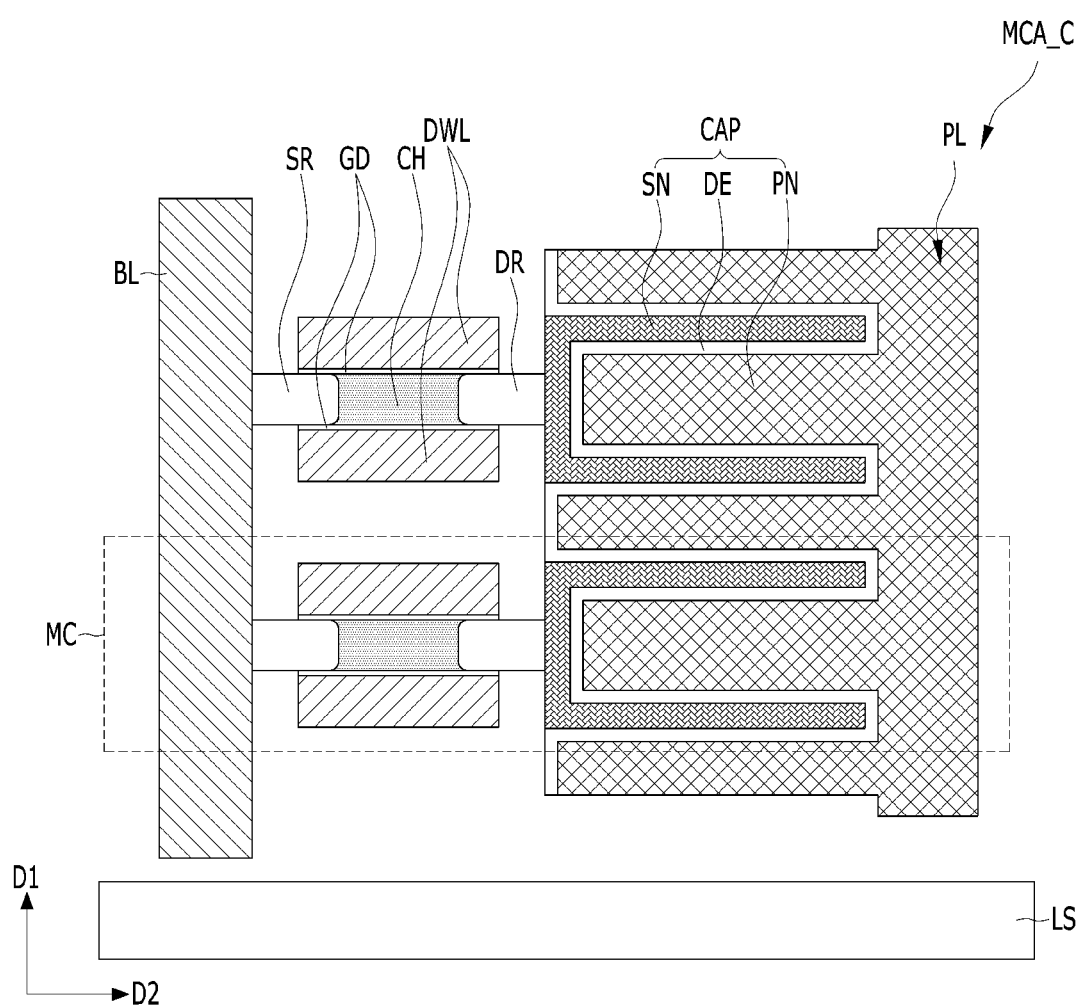
FIG. 4 is a cross-sectional view illustrating a vertical memory cell array MCA_C shown in FIG. 3.

FIG. 3 is a schematic perspective view illustrating a semiconductor device in accordance with an embodiment of the present invention. FIG. 4 is a cross-sectional view illustrating a vertical memory cell array MCA_C shown in FIG. 3.

Referring to FIGS. 3 and 4, the semiconductor device 100 may include a lower structure LS and a memory cell array MCA. A plurality of memory cells MC shown in FIG. 1 may be arranged in the first to third directions D1, D2, and D3 to form the memory cell array MCA shown in FIG. 3. The memory cell array MCA may include a three-dimensional array of memory cells MC, and the three-dimensional memory cell array may include a vertical memory cell array MCA_C and a lateral memory array MCA_R. The vertical memory cell array MCA_C may refer to an array of memory cells MC that are vertically arranged in the first direction D1. The lateral memory cell array MCA_R may refer to an array of memory cells MC that are arranged laterally in the third direction D3. The vertical memory cell array MCA_C may be referred to as a column array of memory cells MC, and the lateral memory cell array MCA_R may be referred to as a row array of memory cells MC. The bit line BL may be vertically oriented to be coupled to the vertical memory cell array MCA_C, and the double word line DWL may be oriented laterally to be coupled to the lateral memory cell array MCA_R. The bit line BL coupled to the vertical memory cell array MCA_C may be referred to as a common bit line, and the vertical memory cell arrays MCA_C that are disposed adjacent to each other in the third direction D3 may be coupled to different common bit lines BL. The double word line DWL coupled to the lateral memory cell array MCA_R may be referred to as a common double word line Common DWL, and the lateral memory cell arrays MCA_R that are disposed adjacent to each other in the first direction D1 may be coupled to different common double word lines.

The memory cell array MCA may include a plurality of memory cells MC, and each memory cell MC may include a vertically oriented bit line BL, a laterally oriented active layer ACT, a double word line DWL, and a laterally oriented capacitor CAP. For example, FIG. 3 illustrates a three-dimensional DRAM memory cell array including four memory cells MC.

The active layers ACT that are disposed adjacent to each other in the first direction D1 may contact one bit line BL. Active layers ACT that are disposed adjacent to each other in the third direction D3 may share the double word line DWL. The capacitors CAP may be respectively coupled to the active layers ACT. The capacitors CAP may share one plate line PL. The individual active layers ACT may be thinner than the first and second word lines WL1 and WL2 of the double word line DWL.

In the memory cell array MCA, a plurality of double word lines DWL may be vertically stacked in the first direction D1. The individual double word line DWL may include a pair of a first word line WL1 and a second word line WL2. Between the first word line WL1 and the second word line WL2, a plurality of active layers ACT may be laterally arranged to be spaced apart from each other in the third direction D3. The channel CH of the active layer ACT may be disposed between the first word line WL1 and the second word line WL2.

The double word line DWL may have a notch-type structure including protrusions PWL. According to another embodiment of the present invention, it may have a linear shape without protrusions PWL. In other words, the double word line DWL may have the same shape as the double word line DWL shown in FIG. 1.

Figure 5:
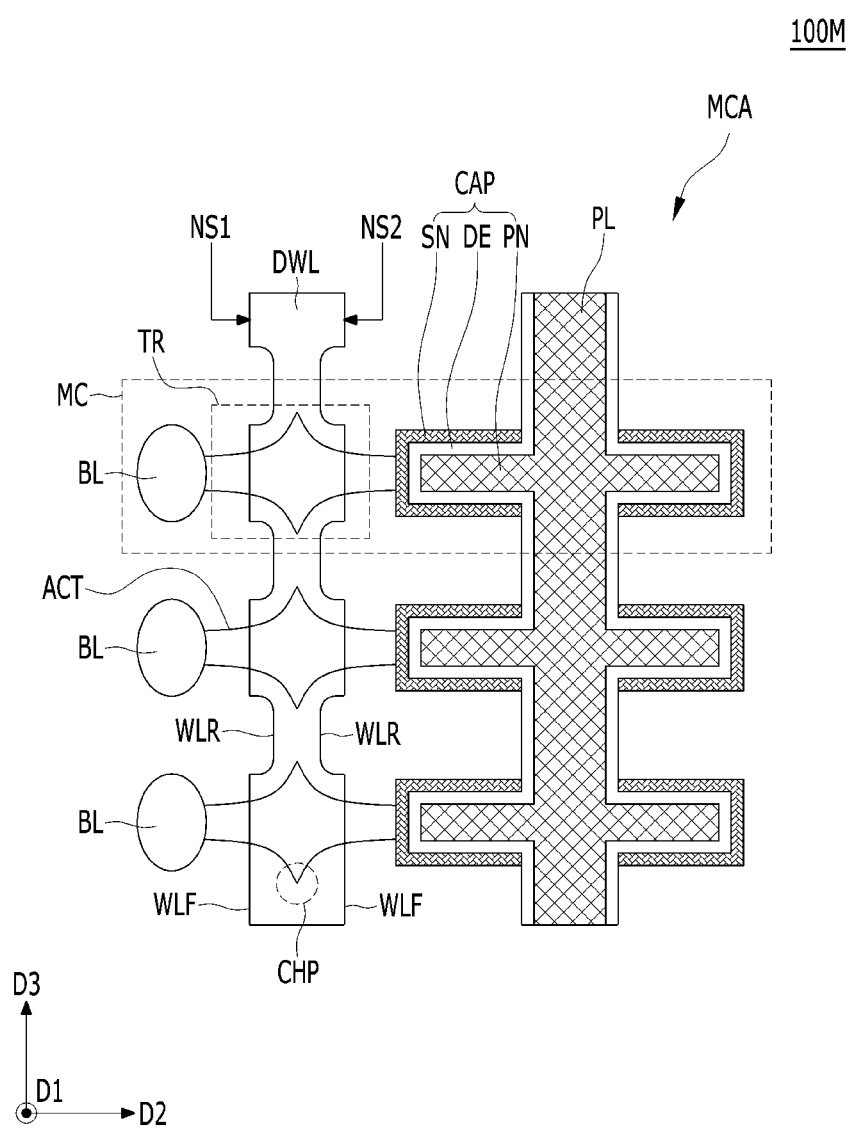
FIG. 5 is a schematic plan view illustrating a semiconductor device in accordance with another embodiment of the present invention.

FIG. 5 is a schematic plan view illustrating a semiconductor device 100M in accordance with another embodiment of the present invention. The semiconductor device 100M shown in FIG. 5 may be similar to the semiconductor device shown in FIGS. 1 to 4. Hereinafter, detailed descriptions on the constituent elements also appearing in FIGS. 1 to 4 will be omitted.

Referring to FIG. 5, the semiconductor device 100M may include a memory cell array MCA, and the memory cell array MCA may include a plurality of memory cells MC. The memory cell array MCA may include a plurality of bit lines BL, a plurality of transistors TR, and a plurality of capacitors CAP. The transistors TR may share one double word line DWL. The bit lines BL may extend vertically in the first direction D1, and the double word lines DWL may extend in the third direction D3. Each of the transistors TR may include an active layer ACT, and the active layers ACT may extend in the second direction D2. Each of the capacitors CAP may include a storage node SN, a dielectric layer DE, and a plate node PN. The plate nodes PN may be coupled to the plate line PL. One end of the active layer ACT may be coupled to the bit line BL, and another end of the active layer ACT may be coupled to the capacitor CAP.

Each of the active layers ACT may include a channel which overlaps with the double word line DWL, and the channel may include a channel protrusion CHP. The active layers ACT may have a rhombus shape. The channel protrusions CHP may vertically overlap with the double word line DWL.

The double word line DWL may include two notch-type sidewalls facing each other. For example, it may include a first notch-type sidewall NS1 and a second notch-type sidewall NS2 that face each other in the second direction D2. The first and second notch-type sidewalls NS1 and NS2 may include a plurality of flat surfaces WLF and a plurality of recess surfaces WLR. The flat surfaces WLF may be disposed adjacent to the bit line BL and the storage node SN. The flat surfaces WLF and the recess surfaces WLR may be alternately formed in the third direction D3. From the perspective of a top view, the recess surfaces WLR may have a round shape.

The double word line DWL having the first and second notch-type sidewalls NS1 and NS2 may be referred to as a notch-type double word line DWL. By forming the notch-type double word line DWL, it is possible to prevent bridging that occurs between the neighboring memory cells MC. Also, as the notch-type double word line DWL is formed, capacitance between the double word lines DWL may be reduced.

The double word line DWL shown in FIG. 3 may also be a notch-type double word line, and the top view shape of the active layer ACT shown in FIG. 3 may be a rectangular shape. The active layer ACT shown in FIG. 3 may have the same rhombus shape as that of the active layer ACT of FIG. 5.

Figure 6A:
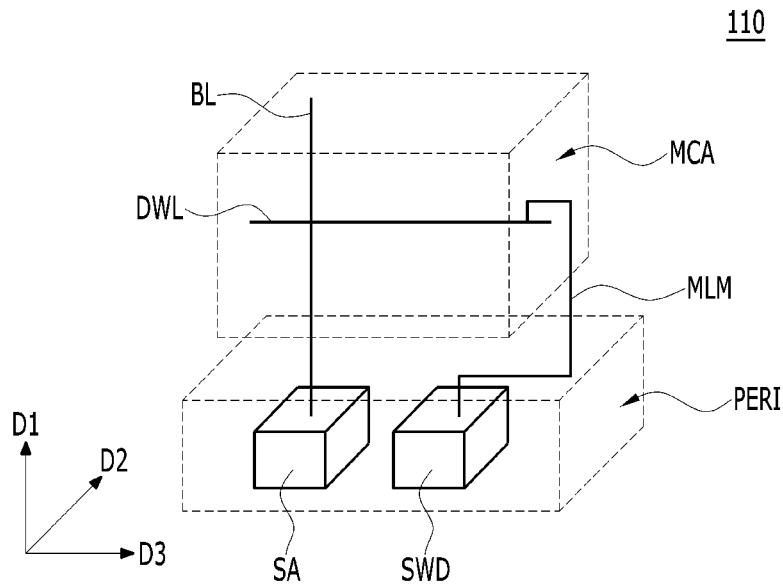
FIGS. 6A and 6B are schematic perspective views illustrating semiconductor devices in accordance with other embodiments of the present invention.
Figure 6B:
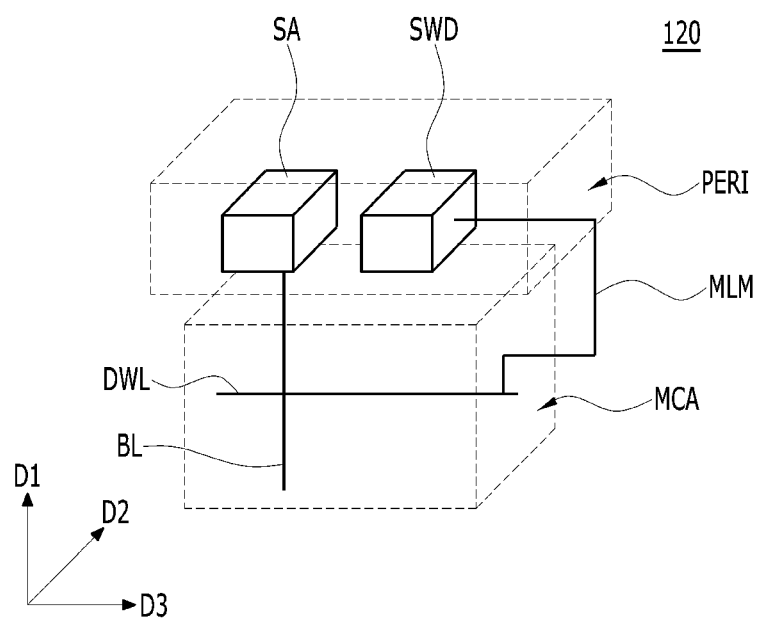

FIGS. 6A and 6B are schematic perspective views illustrating semiconductor devices in accordance with other embodiments of the present invention. FIG. 6A shows a semiconductor device 110 having a COP structure, and FIG. 6B shows a semiconductor device 120 having a POC structure. In FIGS. 6A and 6B, detailed description on the constituent elements also appearing in FIGS. 1 to 5 will be omitted.

Referring to FIG. 6A, the semiconductor device 110 may include a peripheral circuit portion PERI, and the peripheral circuit portion PERI may be disposed at a lower level than the memory cell array MCA. This may be referred to as a COP (Cell-over-PERI) structure. The bit line BL of the memory cell array MCA may be oriented vertically in the first direction D1 with respect to the surface of the peripheral circuit portion PERI, and the double word line DWL may be oriented parallel to the surface of the peripheral circuit portion PERI in the third direction D3.

Referring to FIG. 6B, the semiconductor device 120 may include a memory cell array MCA and a peripheral circuit portion PERI. The peripheral circuit portion PERI may be disposed at a higher level than the memory cell array MCA. This may be referred to as a POC (PERI-over-Cell) structure.

The memory cell array MCA and the peripheral circuit portion PERI of the semiconductor device 120 may be coupled to each other by wafer bonding. For example, a first multi-level metal interconnection which is coupled to the bit lines BL may be formed on the uppermost level of the memory cell array MCA, and the peripheral circuit portion PERI may include a second multi-level metal interconnection. After the direction of the peripheral circuit portion PERI is adjusted in such a manner that the second multi-level metal interconnection is disposed at the bottom, the first multi-level metal interconnection of the memory cell array MCA and the second multi-level metal interconnection of the peripheral circuit portion PERI may be wafer-bonded through bonding pads.

In FIGS. 6A and 6B, the peripheral circuit portion PERI may include at least one control circuit for driving the memory cell array MCA. The at least one control circuit of the peripheral circuit portion PERI may include an N-channel transistor, a P-channel transistor, a CMOS circuit, or a combination thereof. The at least one control circuit of the peripheral circuit portion PERI may include an address decoder circuit, a read circuit, a write circuit, and the like. The at least one control circuit of the peripheral circuit portion PERI may include a planar channel transistor, a recess channel transistor, a buried gate transistor, and a fin channel transistor (FinFET) and the like.

For example, the peripheral circuit portion PERI may include a sub-word line driver SWD and a sense amplifier SA. The double word line DWL may be coupled to the sub-word line driver SWD through a multi-level metal interconnection MLM. The bit lines BL may be coupled to the sense amplifier SA. The bit lines BL and the sense amplifier SA may be coupled to each other through an additional multi-level metal interconnection.

FIGS. 7 to 21 are cross-sectional views illustrating a method for fabricating a semiconductor device in accordance with an embodiment of the present invention.

Figure 7:
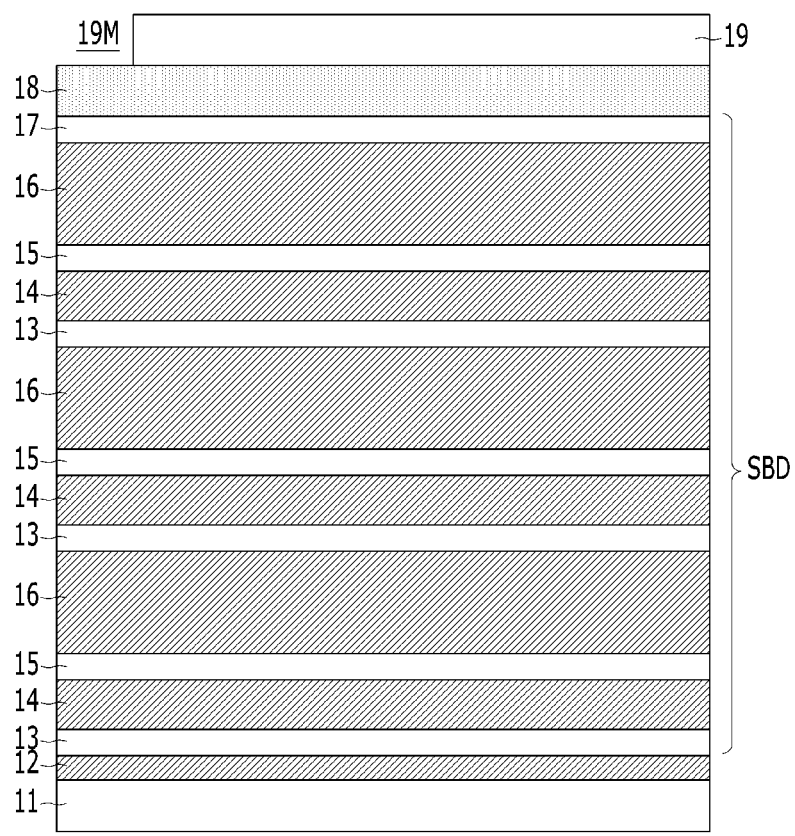
FIGS. 7 to 21 are cross-sectional views illustrating a method for fabricating a semiconductor device in accordance with an embodiment of the present invention.

Referring to FIG. 7, a seed layer 12 may be formed over the lower structure 11. The lower structure 11 may include a semiconductor lower structure. The seed layer 12 may include a semiconductor material. The seed layer 12 may be of a silicon-based material, and may include, for example, silicon (Si). The seed layer 12 may be formed by epitaxial growth. The seed layer 12 may be epitaxial silicon with a thickness of approximately 7 to 10 nm. The seed layer 12 may be a monocrystalline seed layer and may include, for example, monocrystalline silicon.

A stack body SBD including a plurality of sacrificial semiconductor layers 13 and 15 and a plurality of semiconductor layers 14 and 16 may be formed over the seed layer 12. The stack body SBD may have a structure in which the sacrificial semiconductor layers 13 and 15 and the semiconductor layers 14 and 16 are alternately stacked one on another. The stack body SBD may further include an uppermost sacrificial semiconductor layer 17.

The semiconductor layers 14 and 16 may include first semiconductor layers 14 and second semiconductor layers 16. The first semiconductor layers 14 may be thinner than the second semiconductor layers 16. The second semiconductor layers 16 may be approximately 2 to 3 times thicker than the first semiconductor layers 14. For example, the first semiconductor layers 14 may have a thickness of approximately 20 nm, and the second semiconductor layers 16 may have a thickness of approximately 40 nm.

The sacrificial semiconductor layers 13 and 15 may include first sacrificial semiconductor layers 13 and second sacrificial semiconductor layers 15. The first sacrificial semiconductor layers 13 and the second sacrificial semiconductor layers 15 may have the same thickness. The first sacrificial semiconductor layers 13 and the second sacrificial semiconductor layers 15 may be thinner than the first semiconductor layers 14 and the second semiconductor layers 16. The first sacrificial semiconductor layers 13 and the second sacrificial semiconductor layers 15 may be thinner than the first semiconductor layers 14. For example, the first sacrificial semiconductor layers 13 and the second sacrificial semiconductor layers 15 may have a thickness of approximately 7 to 10 nm.

The uppermost sacrificial semiconductor layer 17 may be disposed over the uppermost second semiconductor layer 16 among the first and second semiconductor layers 14 and 16. The uppermost sacrificial semiconductor layer 17 may have the same thickness as those of the first and second sacrificial semiconductor layers 13 and 15. For example, the uppermost sacrificial semiconductor layer 17 may have a thickness of approximately 7 to 10 nm.

According to another embodiment of the present invention, the uppermost sacrificial semiconductor layer 17 may be omitted.

According to another embodiment of the present invention, the semiconductor layers 14 and 16 may be formed by changing the order of the first semiconductor layers 14 and the second semiconductor layers 16. In other words, the first semiconductor layers 14 may be thicker than the second semiconductor layers 16. The first semiconductor layers 14 may be approximately 2 to 3 times thicker than the second semiconductor layers 16. For example, the first semiconductor layers 14 may have a thickness of approximately 40 nm, and the second semiconductor layers 16 may have a thickness of approximately 20 nm.

Each of the first and second semiconductor layers 14 and 16, the first and second sacrificial semiconductor layers 13 and 15, and the uppermost sacrificial semiconductor layer 17 that form the stack body SBD may be formed by an epitaxial growth process. For example, the first semiconductor layers 14, the second semiconductor layers 16, the first sacrificial semiconductor layers 13, the second sacrificial semiconductor layers 15, and the uppermost sacrificial semiconductor layer 17 may be formed of a monocrystalline semiconductor or a monocrystalline semiconductor compound. According to the embodiments of the present invention, the first and second semiconductor layers 14 and 16 may include a first semiconductor material which is selected among monocrystalline silicon and monocrystalline silicon germanium, and the first and second sacrificial semiconductor layers 13 and 15 may include a second semiconductor material which is different from the first semiconductor material. The uppermost sacrificial semiconductor layer 17 may include the same material as the first and second sacrificial semiconductor layers 13 and 15, for example, a second semiconductor material. For example, each of the first and second semiconductor layers 14 and 16 may be of a monocrystalline silicon layer, and each of the first sacrificial semiconductor layers 13, the second sacrificial semiconductor layers 15, and the uppermost sacrificial semiconductor layer 17 may be a monocrystalline silicon germanium layer.

As described above, epitaxial growth may be used to form the stack body SBD over the seed layer 12, and the stack body SBD may be formed by repeatedly forming a plurality of sub-stacks. For example, in each of the sub-stacks, the first sacrificial semiconductor layer 13, the first semiconductor layer 14, the second sacrificial semiconductor layer 15, and the second semiconductor layer 16 may be stacked in the mentioned order.

Subsequently, a dielectric layer 18 may be formed over the stack body SBD. The dielectric layer 18 may include silicon oxide. The dielectric layer 18 may be a hard mask and the dielectric layer 18 may be omitted.

A mask layer 19 may be formed over the dielectric layer 18. The mask layer 19 may include at least one opening 19M, and the dielectric layer 18 may be exposed by the opening 19M. The mask layer 19 may be of a material having an etch selectivity with respect to the dielectric layer 18 and the stack body SBD. The mask layer 19 may include a photoresist, silicon nitride, silicon oxynitride, amorphous silicon, amorphous carbon, an anti-reflective coating (ARC) material, or a combination thereof.

Figure 8:
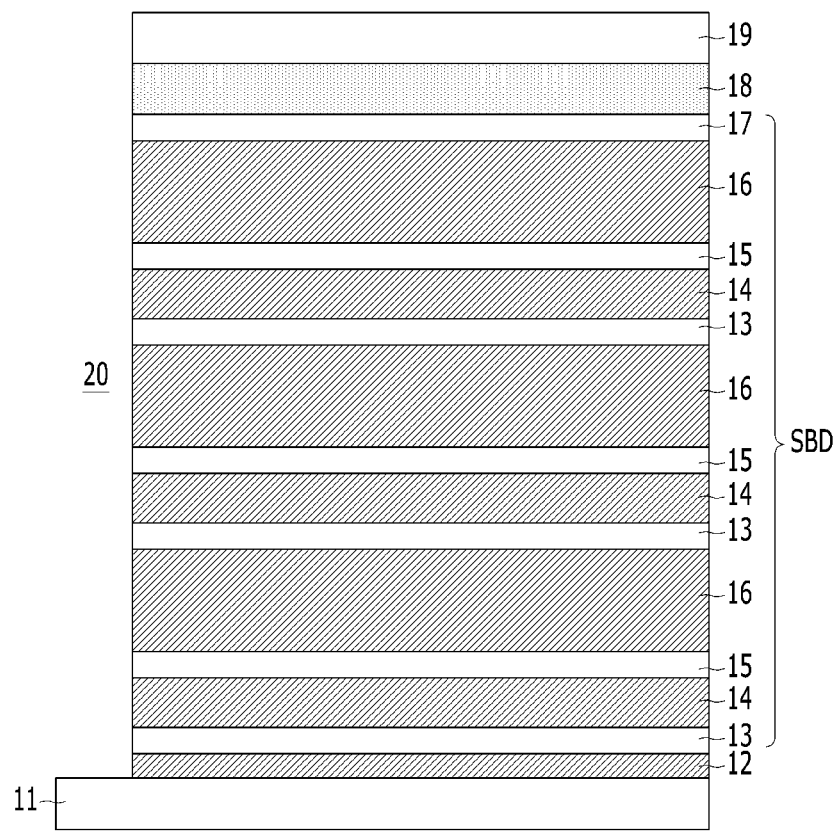

Referring to FIG. 8, at least one first opening 20 may be formed in the stack body SBD. To form the first opening 20, the dielectric layer 18, the stack body SBD, and the seed layer 12 may be sequentially etched. For example, the dielectric layer 18 may be etched by using the mask layer 19 as an etch mask, and then the stack body SBD and the seed layer 12 may be etched. The first opening 20 may extend vertically through the dielectric layer 18, the stack body SBD, and the seed layer 12. The first opening 20 may expose the surface of the lower structure 11.

Figure 9:
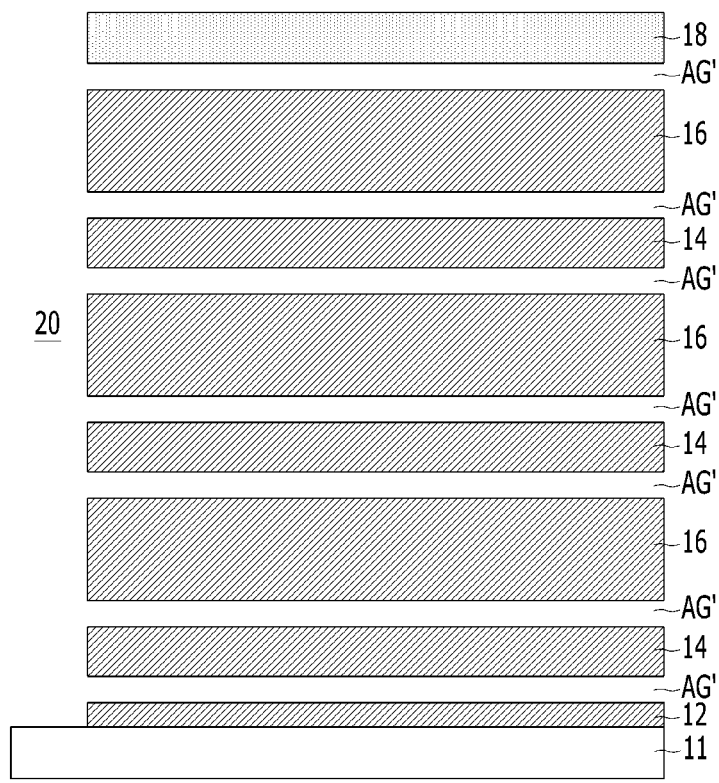

Referring to FIG. 9, a plurality of initial lateral recesses AG' may be formed between the first semiconductor layers 14 and the second semiconductor layers 16. While the initial lateral recesses AG' are formed, the initial lateral recesses AG' may also be formed between the dielectric layer 18 and the uppermost second semiconductor layer 16. The first sacrificial semiconductor layers 13, the second sacrificial semiconductor layers 15, and the uppermost sacrificial semiconductor layer 17 may be selectively removed to form the initial lateral recesses AG'. The initial lateral recesses AG' may have the same size, for example, the same height.

The first sacrificial semiconductor layers 13, the second sacrificial semiconductor layers 15, and the uppermost sacrificial semiconductor layer 17 may be selectively removed based on the difference between the etch selectivity of the first and second semiconductor layers 14 and 16 and the etch selectivity of the first and second sacrificial semiconductor layers 13 and 15. The first sacrificial semiconductor layers 13, the second sacrificial semiconductor layers 15, and the uppermost sacrificial semiconductor layer 17 may be selectively removed by wet etching or dry etching. For example, when the first sacrificial semiconductor layers 13, the second sacrificial semiconductor layers 15, and the uppermost sacrificial semiconductor layer 17 include silicon germanium and the first and second semiconductor layers 14 and 16 include silicon, silicon germanium may be etched by using an etchant or an etch gas having a selectivity with respect to the silicon layers.

Figure 10:
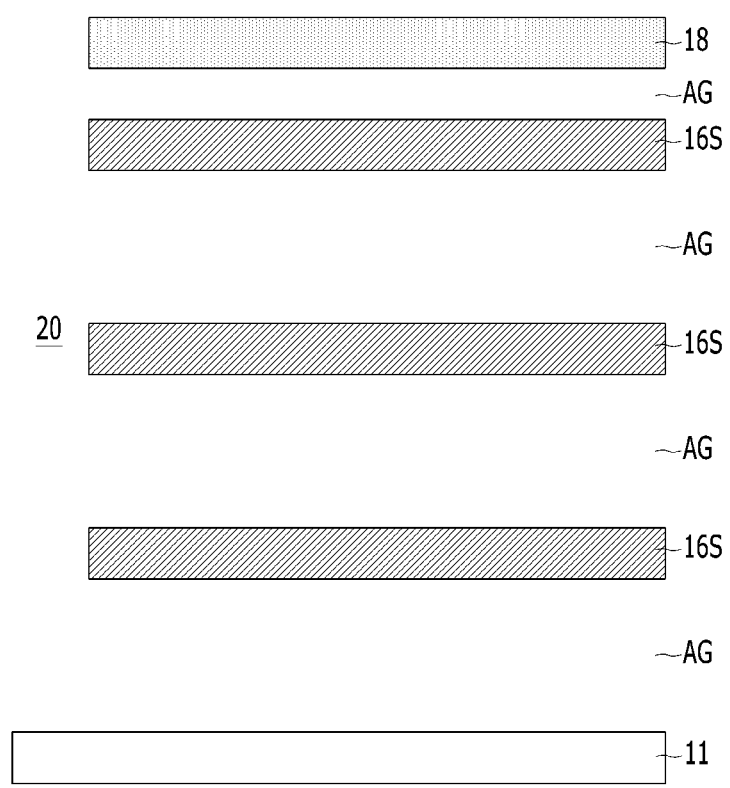

Referring to FIG. 10, the first and second semiconductor layers 14 and 16 may be recessed through the initial lateral recesses AG'. In order to recess the first and second semiconductor layers 14 and 16, the first and second semiconductor layers 14 and 16 may be etched by wet etching or dry etching. According to the embodiment of the present invention, the second semiconductor layers 16 may be partially etched until the first semiconductor layers 14 are removed. Accordingly, all of the thin first semiconductor layers 14 may be removed, and the thick second semiconductor layers 16 may be thinned as represented by a reference numeral '16S'. The recessing process of the first and second semiconductor layers 14 and 16 may be referred to as a thinning process of the second semiconductor layers 16. The thinned second semiconductor layers 16S may be simply referred to as a thin-body active layer '16S'. The thin-body active layer 16S may include monocrystalline silicon. While the first semiconductor layers 14 are removed, all of the seed layer 12 may also be removed, and the surface of the lower structure 11 may be recessed to a predetermined depth.

After the etching of the first and second semiconductor layers 14 and 16, the initial lateral recesses AG' may be widened in a vertical direction. For example, a plurality of initial recesses AG may be formed between the thin-body active layers 16S, and the initial recesses AG may be larger in size than the initial lateral recesses AG'. The uppermost initial recess AG among the initial recesses AG may be disposed between the dielectric layer 18 and the uppermost thin-body active layer 16S. The uppermost initial recess AG may have a height smaller than the initial recesses AG of other levels.

Figure 11:
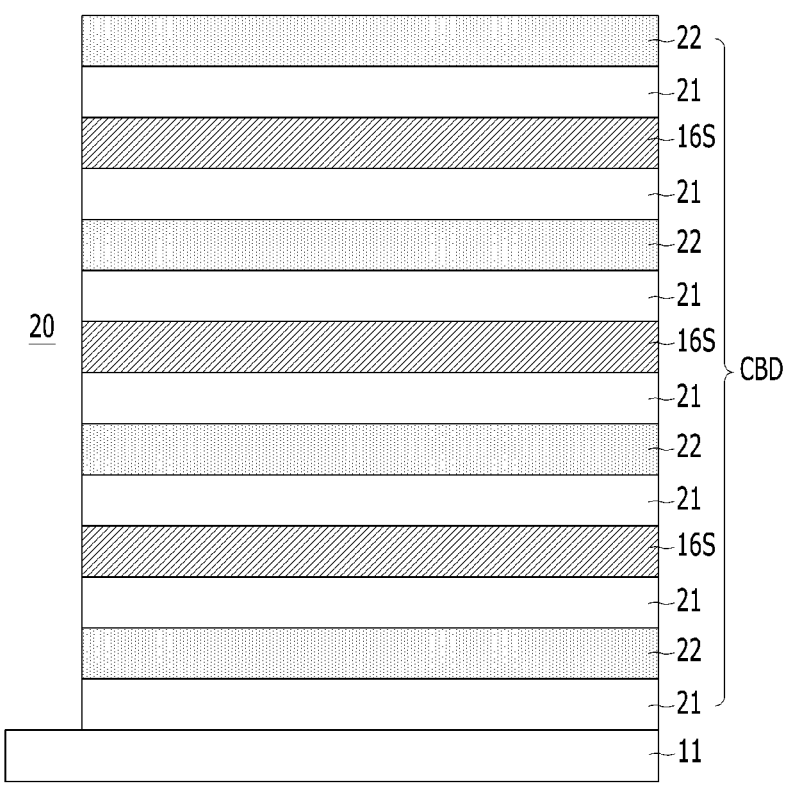

Referring to FIG. 11, the initial recesses AG may be filled with dielectric materials 21 and 22. The dielectric materials 21 and 22 may include sacrificial dielectric layers 21 and cell isolation dielectric layers 22. First, a plurality of sacrificial dielectric layers 21 may be formed to cover the thin-body active layers 16S, and a plurality of cell isolation dielectric layers 22 may be successively formed over the sacrificial dielectric layers 21. The thin-body active layers 16S and the sacrificial dielectric layers 21 may directly contact each other. The sacrificial dielectric layers 21 and the cell isolation dielectric layers 22 may be formed of different materials. The sacrificial dielectric layers 21 may include silicon nitride, and the cell isolation dielectric layers 22 may include silicon oxide. The cell isolation dielectric layers 22 and the dielectric layer 18 may be formed of the same material. Hereinafter, the dielectric layer 18 may be denoted by a reference numeral '22', and may be simply referred to as a cell isolation dielectric layer.

As described above, as the sacrificial dielectric layers 21 and the cell isolation dielectric layers 22 are formed, the cell body CBD may be formed over the lower structure 11. The cell body CBD may include a plurality of thin-body active layers 16S, a plurality of sacrificial dielectric layers 21, and a plurality of cell isolation dielectric layers 22. The cell body CBD may include a plurality of sub-stacks that are disposed between the cell isolation dielectric layers 22. Here, the sub-stacks may have a structure in which one thin-body active layer 16S is disposed between two sacrificial dielectric layers 21. Since the cell isolation dielectric layers 22, the sacrificial dielectric layers 21, and the thin-body active layers 16S include silicon oxide, silicon nitride, and monocrystalline silicon layers, respectively, the cell body CBD may include a structure in which an ONSN (Oxide-Nitride-Silicon-Nitride) stack is stacked several times.

Figure 12:
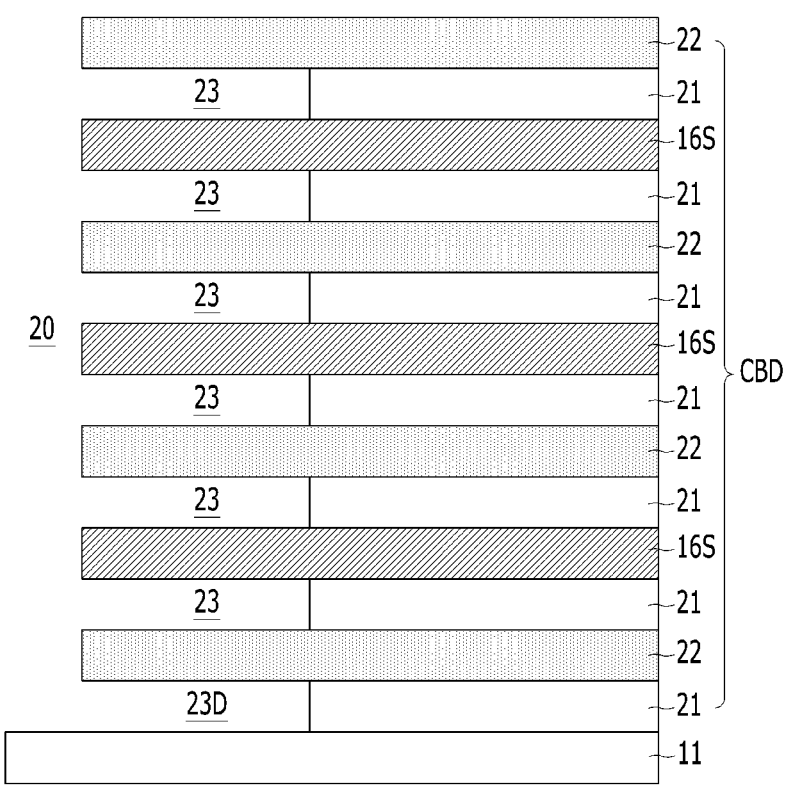

Referring to FIG. 12, word line recesses 23 may be formed in the cell body CBD. To form the word line recesses 23, portions of the sacrificial dielectric layers 21 may be selectively etched. A dummy word line recess 23D may be formed between the lower structure 11 and the lowermost-level cell isolation dielectric layer 22.

A portion of the thin-body active layers 16S may be exposed by the word line recesses 23.

Figure 13:
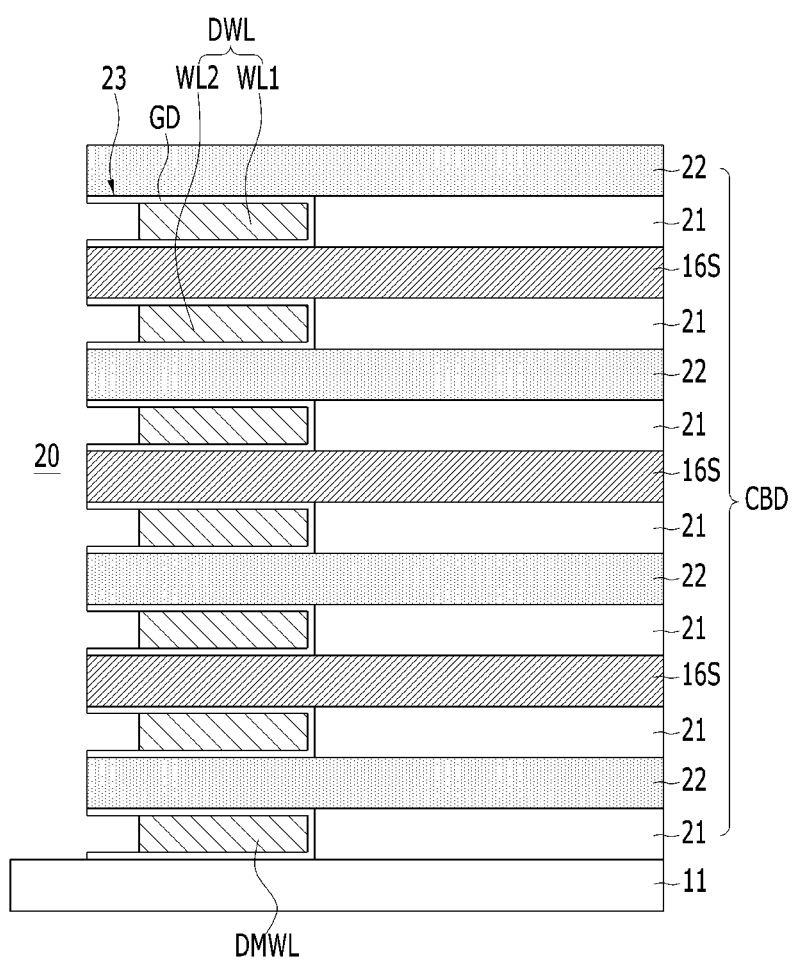

Referring to FIG. 13, a gate dielectric layer GD may be formed over the exposed portion of the thin-body active layer 16S. The gate dielectric layer GD may be selectively formed on the surface of the thin-body active layer 16S by an oxidation process. According to another embodiment of the present invention, the gate dielectric layer GD may be formed by a deposition process. In this case, the gate dielectric layer GD may be formed on the surface of the word line recesses 23 and on the surface of the thin-body active layers 16S.

Subsequently, a double word line DWL may be formed by filling each of the word line recesses 23 with a conductive material. The double word line DWL may include polysilicon, titanium nitride, tungsten, or a combination thereof. For example, the forming of the double word line DWL may include conformally depositing titanium nitride, depositing tungsten on the titanium nitride to fill the word line recesses 23, and etching back titanium nitride and tungsten. The double word line DWL may partially fill the word line recesses 23, and thus a portion of the gate dielectric layer GD may be exposed. Each double word line DWL may include a first word line WL1 and a second word line WL2. The first word line WL1 and the second word line WL2 may vertically face each other with the thin-body active layers 16S interposed therebetween. The double word line DWL, the first word line WL1, and the second word line WL2 shown in FIG. 13 may correspond to the double word line DWL, the first word line WL1, and the second word line WL2 shown in FIGS. 1 to 5.

A dummy word line DMWL filling a dummy word line recess 23D may be formed while the double word line DWL is formed. The dummy word line DMWL may be formed of the same material as that of the double word line DWL.

Figure 14:
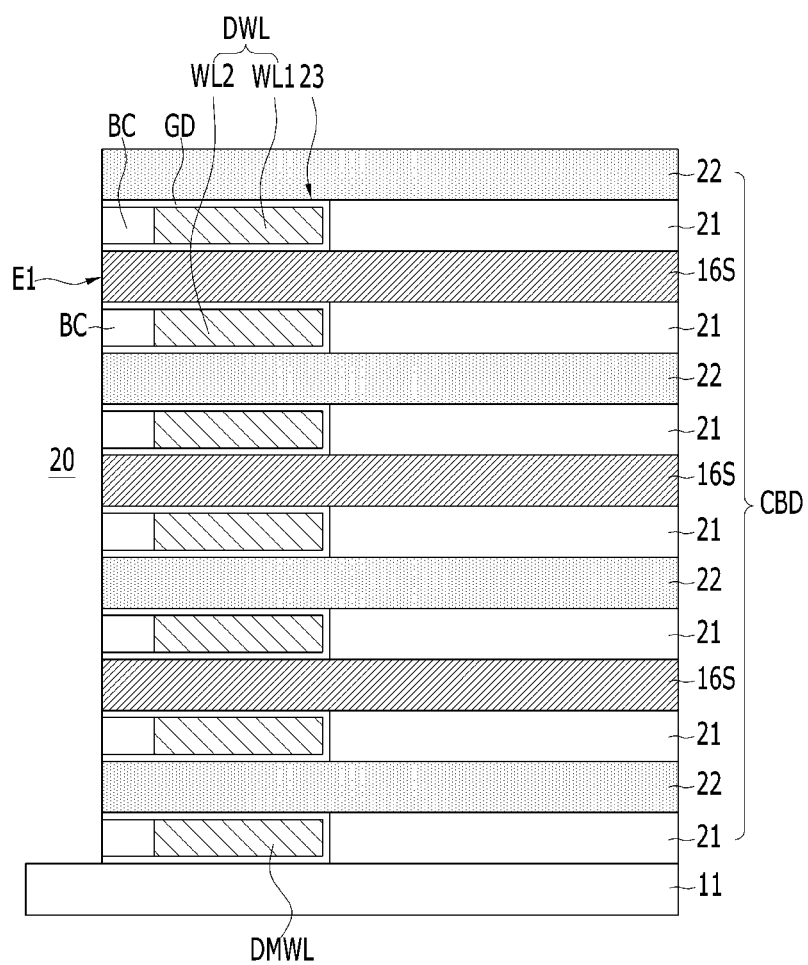

Referring to FIG. 14, bit line-side capping layers BC in contact with one side of the double word line DWL may be formed. The bit line-side capping layers BC may be disposed in the word line recesses 23. The bit line-side-capping layers BC may include silicon oxide, silicon nitride, or a combination thereof. The bit line side-capping layers BC may contact the first and second word lines WL1 and WL2.

The first end E1 of the thin-body active layer 16S may be exposed by the bit line-side-capping layers BC.

Figure 15:
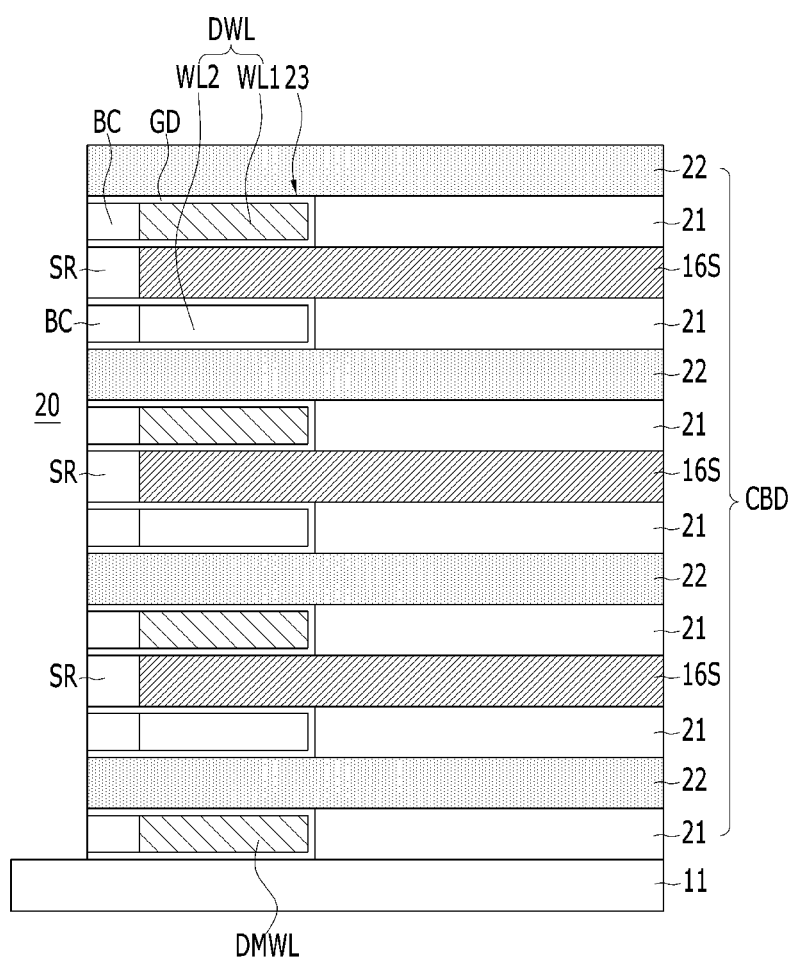

Referring to FIG. 15, a first source/drain region SR may be formed at a first end E1 of the thin-body active layer 16S. The first source/drain regions SR may be formed by depositing a conductive layer including an impurity and performing annealing. According to another embodiment of the present invention, the first source/drain regions SR may be formed by a process of doping an impurity.

Figure 16:
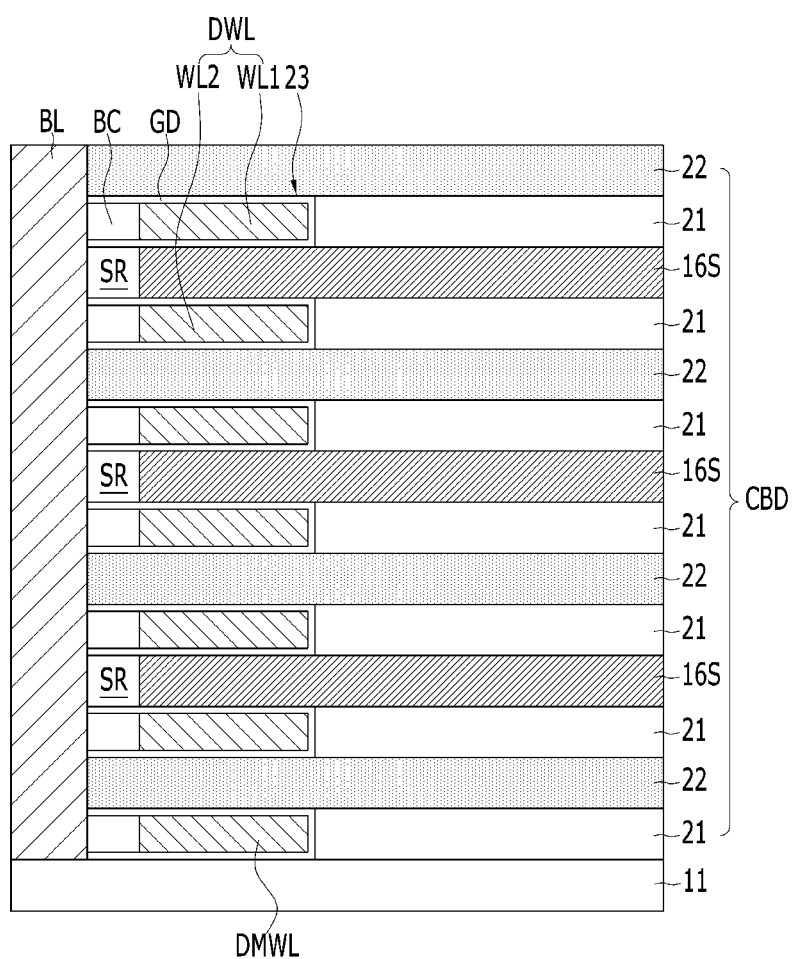

Referring to FIG. 16, a bit line BL may be formed. The bit line BL may have a pillar shape filling the first opening 20. The bit line BL may include titanium nitride, tungsten, or a combination thereof.

Figure 17:
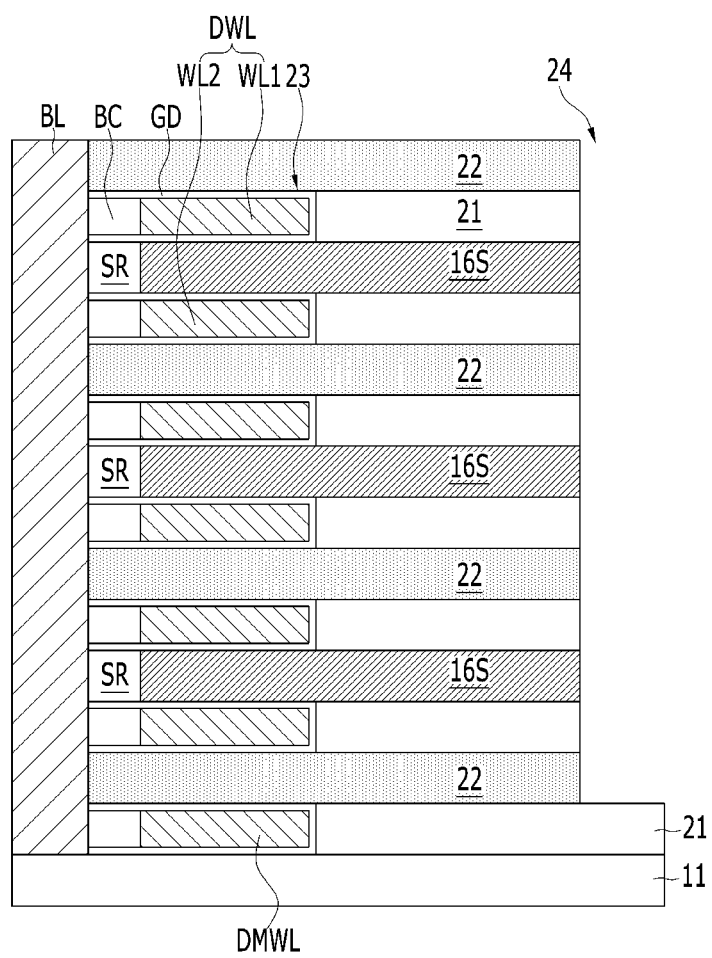

Referring to FIG. 17, a second opening 24 may be formed by etching another portion of the cell body CBD. The second opening 24 may extend vertically. The second opening 24 may have a hole shape passing through another portion of the cell body CBD.

Figure 18:
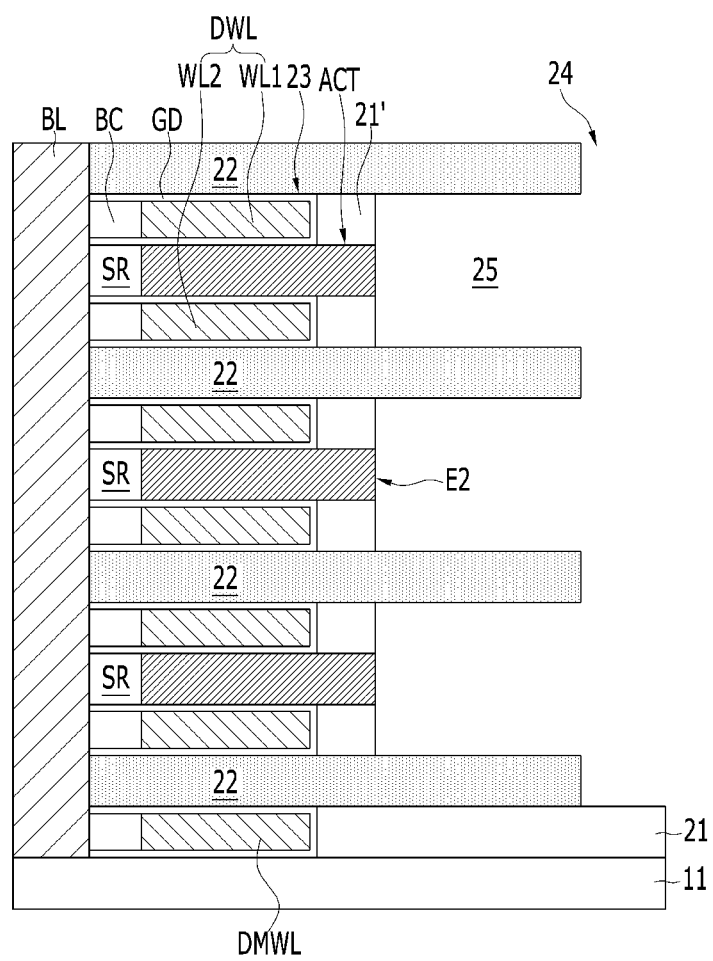

Referring to FIG. 18, the sacrificial dielectric layers 21 and the thin-body active layers 16S may be selectively recessed through the second opening 24. As a result, the capacitor opening 25 may be formed between the cell isolation dielectric layers 22. After the processes for forming the second opening 24 and the capacitor opening 25 are performed, the remaining thin-body active layer 16S may remain as represented by a reference symbol 'ACT'. First and second word lines WL1 and WL2 may be formed with the thin-body active layer ACT interposed therebetween, and a gate dielectric layer GD may be disposed between the thin-body active layer ACT and the first and second word lines WL1 and WL2. The thin-body active layer ACT may be referred to as a monocrystalline silicon active layer.

Subsequently, the sacrificial dielectric layers 21 may be further recessed. As a result, an empty space (or lateral recess) may be provided on one side of the sacrificial dielectric layers 21, and a second end E2 of the thin-body active layer ACT may be exposed by the empty space. The remaining sacrificial dielectric layers may become a storage node-side capping layer 21'. The storage node-side capping layer 21' may cover an upper surface and a lower surface of the thin-body active layer ACT.

Figure 19:
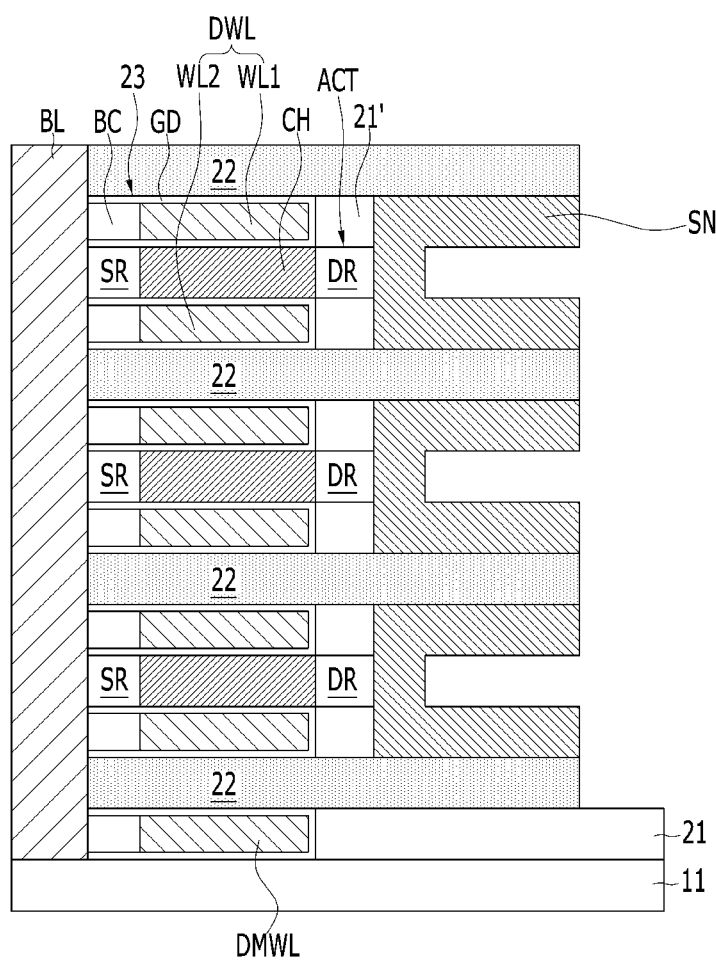

Referring to FIG. 19, a second source/drain region DR may be formed in the thin-body active layer ACT. As a result, the first source/drain region SR and the second source/drain region DR that are laterally spaced apart from each other may be formed in the thin-body active layer ACT, and a channel CH may be defined between the first source/drain region SR and the second source/drain region DR.

Subsequently, a storage node SN may be formed over the second source/drain region DR. In order to form the storage node SN, a conductive material may be deposited and an etch-back process may be performed. The storage node SN may include titanium nitride. The storage node SN may have a laterally oriented cylinder shape. The individual storage node SN may be coupled to the respective second source/drain regions DR.

Figure 20:
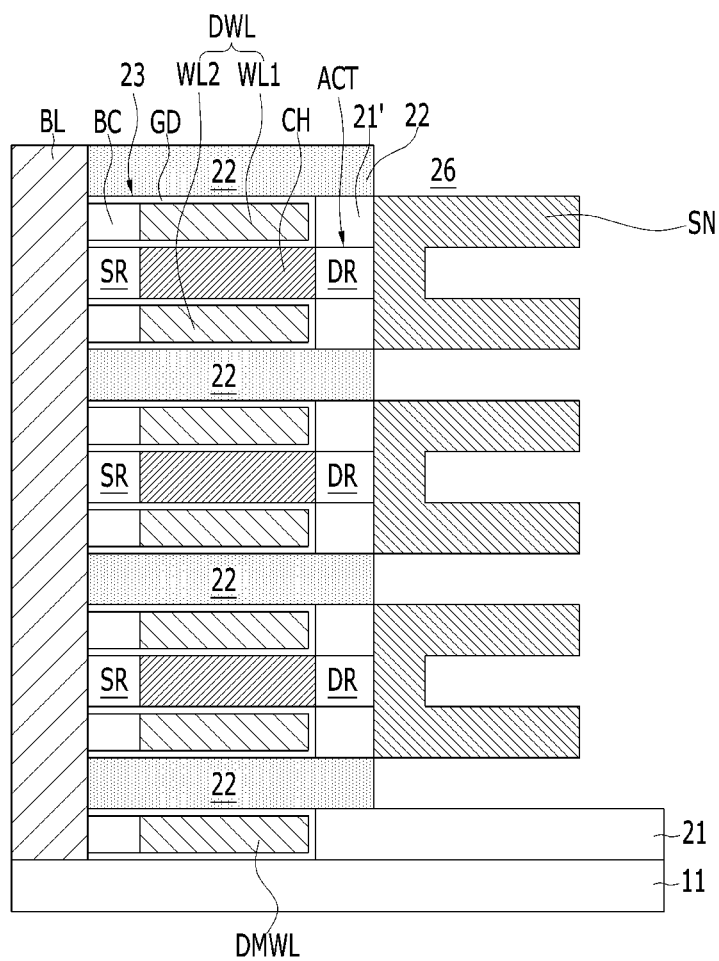

Referring to FIG. 20, the cell isolation dielectric layers 22 may be recessed (refer to a reference numeral 26) to expose the outer wall of the storage node SN.

Figure 21:
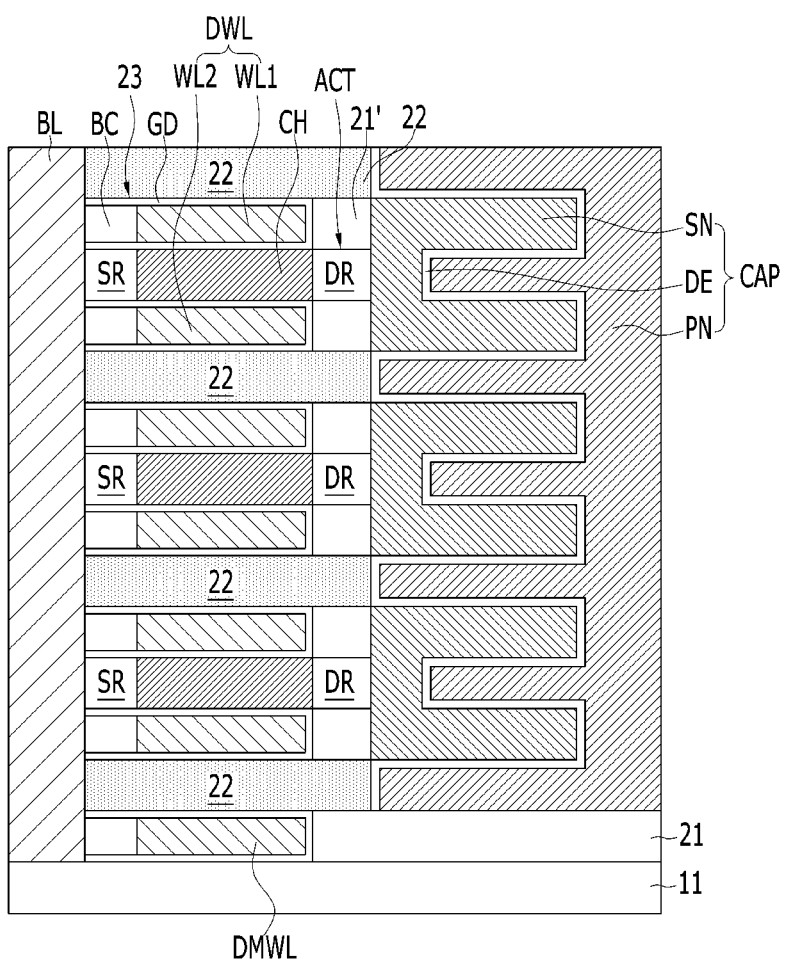

Referring to FIG. 21, a dielectric layer DE and a plate node PN may be sequentially formed over the storage node SN.

Referring to FIGS. 7 to 21, when the thin body-active layers ACT include a monocrystalline active layer, the semiconductor device may include:

a lower structure 11, cell isolation dielectric layers 22 that are stacked vertically over the lower structure 11 to be parallel to the lower structure 11, monocrystalline silicon active layers ACT disposed between the cell isolation dielectric layers 22 and laterally oriented to be parallel to the lower structure 11, word lines WL1 and WL2 that are laterally oriented to cross the monocrystalline silicon active layers ACT between the cell isolation dielectric layers 22, a bit line BL that are commonly coupled to one side of the monocrystalline silicon active layers ACT and extending in a direction perpendicular to the lower structure LS, and capacitors CAP coupled to another side of the monocrystalline silicon active layers ACT. The semiconductor device may further include a dummy word line DMWL which is disposed between the lowermost word line WL2 among the word lines WL1 and WL2 and the lower structure 11. A cell isolation dielectric layer 22 may be disposed between the lowermost word line WL2 and the dummy word line DMWL. The plate nodes PN may be spaced apart from the lower structure 11.

The dummy word line and the lowermost word line may be isolated from each other by the lowermost cell isolation dielectric layer among the cell isolation dielectric layers.

According to the embodiment of the present invention, a thin-body active layer may be formed by using monocrystalline silicon, improving the reliability of the semiconductor device.

According to the embodiment of the present invention, it is possible to improve the metal contact etch margin and prevent the metal contact from being punched.

The effects desired to be obtained in the embodiments of the present invention are not limited to the effects mentioned above, and other effects not mentioned above may also be clearly understood by those of ordinary skill in the art to which the present invention pertains from the description below.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
   forming a stack body by alternately stacking a plurality of semiconductor layers and a plurality of sacrificial semiconductor layers over a lower structure;
   forming an opening by etching the stack body;
   forming a plurality of active layers and a plurality of lateral recesses by etching the semiconductor layers and the sacrificial semiconductor layers through the opening;
   forming sacrificial dielectric layers partially filling the lateral recesses and contacting the active layers; and
   replacing the sacrificial dielectric layers with word lines,
   wherein the semiconductor layers include first semiconductor layers and second semiconductor layers that are thicker than the first semiconductor layers, and
   wherein the forming of the plurality of active layers and the plurality of lateral recesses includes:
   forming an initial lateral recess by removing the sacrificial semiconductor layers; and
   thinning the second semiconductor layers while removing the first semiconductor layers to form the lateral recesses that are wider than the initial lateral recess and to form the active layers between the lateral recesses.

2. The method of claim 1, wherein each of the semiconductor layers includes a monocrystalline silicon layer, and
   each of the sacrificial semiconductor layers includes a monocrystalline silicon germanium layer.

3. The method of claim 1, wherein the sacrificial dielectric layers include silicon nitride.

4. The method of claim 1, wherein the semiconductor layers are formed to be thicker than the sacrificial semiconductor layers.

5. The method of claim 1, wherein the forming of the stack body includes:
   repeatedly forming a plurality of sub-stacks by using epitaxial growth over the lower structure, and
   each of the sub-stacks includes a first sacrificial semiconductor layer, a first semiconductor layer, a second sacrificial semiconductor layer, and a second semiconductor layer stacked in an order as recited, and wherein the second semiconductor layer is thicker than the first semiconductor layer.

6. The method of claim 5, wherein the second semiconductor layer is formed to be 2 to 3 times thicker than the first semiconductor layer,
   the first semiconductor layer is formed to be thicker than the first and second sacrificial semiconductor layers, and
   the first sacrificial semiconductor layer and the second sacrificial semiconductor layer are formed to have the same thickness.

7. The method of claim 5, wherein in the sub-stacks, a lowermost material and an uppermost material include the first sacrificial semiconductor layer.

8. The method of claim 5, wherein in the sub-stacks, a lowermost material includes the first sacrificial semiconductor layer, and an uppermost material includes the second sacrificial semiconductor layer.

9. The method of claim 5, wherein each of the first and second semiconductor layers includes a monocrystalline silicon layer, and
   each of the first and second sacrificial semiconductor layers includes a monocrystalline silicon germanium layer.

10. The method of claim 5, further comprising:
    forming a monocrystalline seed layer between the lower structure and the sub-stacks,
    wherein the monocrystalline seed layer is thinner than the first and second semiconductor layers and has the same thickness as thicknesses of the first and second sacrificial semiconductor layers.

11. The method of claim 10, wherein each of the monocrystalline seed layer, the first semiconductor layer, and the second semiconductor layer includes a monocrystalline silicon layer, and
    each of the first and second sacrificial semiconductor layers includes a monocrystalline silicon germanium layer.

12. The method of claim 10, wherein the monocrystalline seed layer and the lowermost first sacrificial semiconductor layer are replaced with dummy word lines.

13. The method of claim 1, further comprising, after the forming of the sacrificial dielectric layers partially filling the lateral recesses and contacting the active layers:
    forming cell isolation dielectric layers filling between the sacrificial dielectric layers,
    wherein the sacrificial dielectric layers and the cell isolation dielectric layers include different materials.

14. The method of claim 1, further comprising:
    forming a bit line which is commonly coupled to first end portions of the active layers and oriented perpendicular to a surface of the lower structure; and
    forming a capacitor including a storage node individually coupled to second end portions of the active layers.

15. A method for fabricating a semiconductor device, the method comprising:
    forming a seed silicon layer over a lower structure;
    repeatedly forming a sub-stack in which a first monocrystalline silicon germanium layer, a first monocrystalline silicon layer, a second monocrystalline silicon germanium layer, and a second monocrystalline silicon layer are stacked in a mentioned order over the seed silicon layer;

forming an opening by etching the sub-stacks and the seed silicon layer;

forming initial lateral recesses by removing the first and second monocrystalline silicon germanium layers through the opening;

thinning the second monocrystalline silicon layers while removing the first monocrystalline silicon layers to form lateral recesses that are wider than the initial lateral recess and to form thin-body active layers between the lateral recesses;

forming sacrificial dielectric layers partially filling the lateral recesses and contacting the thin-body active layers; and replacing the sacrificial dielectric layers with word lines.

16. The method of claim 15, wherein the second monocrystalline silicon layers are formed thicker than the first monocrystalline silicon layers, and the first and second monocrystalline silicon germanium layers are formed thinner than the first monocrystalline silicon layers.

17. The method of claim 15, wherein the second monocrystalline silicon layers are formed to be 2 to 3 times thicker than the first monocrystalline silicon layers.

18. The method of claim 15, wherein each of the seed silicon layer, the first monocrystalline silicon germanium layer, the first monocrystalline silicon layer, the second monocrystalline silicon germanium layer, and the second monocrystalline silicon layer is formed by epitaxial growth.

19. The method of claim 15, wherein the seed silicon layer and a lowermost first monocrystalline silicon germanium layer are replaced with a lowermost sacrificial dielectric layer among the sacrificial dielectric layers, and the lowermost sacrificial dielectric layer is replaced with a dummy word line.

20. The method of claim 15, further comprising, after the replacing of the sacrificial dielectric layers with word lines:

forming a bit line which is commonly coupled to one-side end portions of the thin-body active layers and extends in a direction perpendicular to a surface of the lower structure; and forming a capacitor coupled to each of another-side end portions of the thin-body active layers.

* * * * *